(12) United States Patent
Kim et al.

(10) Patent No.: US 11,604,386 B2
(45) Date of Patent: Mar. 14, 2023

(54) LIGHT EMITTING APPARATUS AND WINDOW

(71) Applicant: ELECTRONICS AND TELECOMMUNICATIONS RESEARCH INSTITUTE, Daejeon (KR)

(72) Inventors: Gi Heon Kim, Daejeon (KR); Sujung Kim, Daejeon (KR); Yong Hae Kim, Daejeon (KR); Chi-Sun Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/700,118

(22) Filed: Mar. 21, 2022

(65) Prior Publication Data

US 2022/0214571 A1    Jul. 7, 2022

Related U.S. Application Data

(60) Continuation of application No. 17/173,718, filed on Feb. 11, 2021, now abandoned, which is a division of application No. 16/528,220, filed on Jul. 31, 2019, now Pat. No. 10,948,784, which is a division of
(Continued)

(30) Foreign Application Priority Data

Dec. 1, 2016  (KR) .................. 10-2016-0163024

(51) Int. Cl.
*G02F 1/1343* (2006.01)
*H01L 33/00* (2010.01)
*H01L 33/42* (2010.01)
*H05B 33/10* (2006.01)
*G02F 1/1334* (2006.01)
(Continued)

(52) U.S. Cl.
CPC .......... *G02F 1/1343* (2013.01); *G02F 1/1334* (2013.01); *H01L 33/005* (2013.01); *H01L 33/42* (2013.01); *H05B 33/10* (2013.01); *G02F 2201/44* (2013.01); *H01L 27/32* (2013.01); *H01L 51/0001* (2013.01)

(58) Field of Classification Search
None
See application file for complete search history.

(56) References Cited

U.S. PATENT DOCUMENTS 8,736,790 B2    5/2014  Lee
8,830,151 B2 *  9/2014  Kim .................. G09G 3/3413
                                                349/71
(Continued)

FOREIGN PATENT DOCUMENTS

JP    H06-15031 U      2/1994
KR    10-2008-0000246 A   1/2008
(Continued)

*Primary Examiner* — Ryan Crockett
(74) *Attorney, Agent, or Firm* — Rabin & Berdo, P.C.

(57) ABSTRACT

A method for manufacturing a window includes preparing a liquid crystal device comprising a support substrate, a first electrode, a liquid crystal layer, and a sacrificial structure. The method further includes removing the sacrificial structure from the liquid crystal device, forming a second electrode disposed on a glass layer, and attaching the liquid crystal device to the second electrode.

10 Claims, 8 Drawing Sheets

Related U.S. Application Data application No. 15/654,831, filed on Jul. 20, 2017, now Pat. No. 10,409,116.

(51) Int. Cl.
*H01L 51/00* (2006.01)
*H01L 27/32* (2006.01)

(56) References Cited

U.S. PATENT DOCUMENTS

| | | | |
|---|---|---|---|
| 8,921,129 B2* | 12/2014 | Lee | H01L 51/0013 |
| | | | 430/300 |
| 2004/0233349 A1* | 11/2004 | Shibuya | G02F 1/1334 |
| | | | 349/88 |
| 2006/0216909 A1 | 9/2006 | Yamazaki et al. | |
| 2008/0304248 A1* | 12/2008 | Jin | H01L 27/3267 |
| | | | 349/1 |
| 2009/0284904 A1* | 11/2009 | Wu | G02F 1/133305 |
| | | | 361/679.01 |
| 2010/0315568 A1* | 12/2010 | Chien | G02F 1/1395 |
| | | | 349/33 |
| 2011/0304799 A1* | 12/2011 | Lee | G02F 1/13475 |
| | | | 427/508 |
| 2012/0188499 A1* | 7/2012 | Nakai | G02F 1/133615 |
| | | | 349/193 |
| 2012/0228617 A1* | 9/2012 | Ko | H01L 51/0097 |
| | | | 438/34 |
| 2014/0098310 A1* | 4/2014 | Lee | G02F 1/13378 |
| | | | 445/24 |
| 2014/0184968 A1* | 7/2014 | Niikura | G02F 1/1391 |
| | | | 349/167 |
| 2015/0146134 A1* | 5/2015 | Kim | C09K 19/60 |
| | | | 252/299.1 |
| 2015/0153593 A1* | 6/2015 | Gu | G02F 1/133553 |
| | | | 427/108 |
| 2015/0234214 A1* | 8/2015 | Hong | H01L 27/1259 |
| | | | 438/151 |
| 2015/0359065 A1* | 12/2015 | Park | H05B 33/145 |
| | | | 313/511 |
| 2016/0197131 A1* | 7/2016 | Park | H01L 51/56 |
| | | | 438/23 |
| 2016/0246116 A1* | 8/2016 | Yang | G02F 1/133308 |
| 2016/0343782 A1* | 11/2016 | Wen | G02F 1/133555 |
| 2018/0157076 A1* | 6/2018 | Kim | H01L 33/42 |
| 2020/0201065 A1* | 6/2020 | Zhang | G02B 30/24 |

FOREIGN PATENT DOCUMENTS

| | | |
|---|---|---|
| KR | 10-2009-0113913 A | 11/2009 |
| KR | 10-2011-0050173 A | 5/2011 |
| KR | 10-2012-0042028 A | 5/2012 |
| KR | 10-2013-0130610 A | 12/2013 |
| KR | 10-2014-0060147 A | 5/2014 |
| KR | 10-2014-0139853 A | 12/2014 |

* cited by examiner

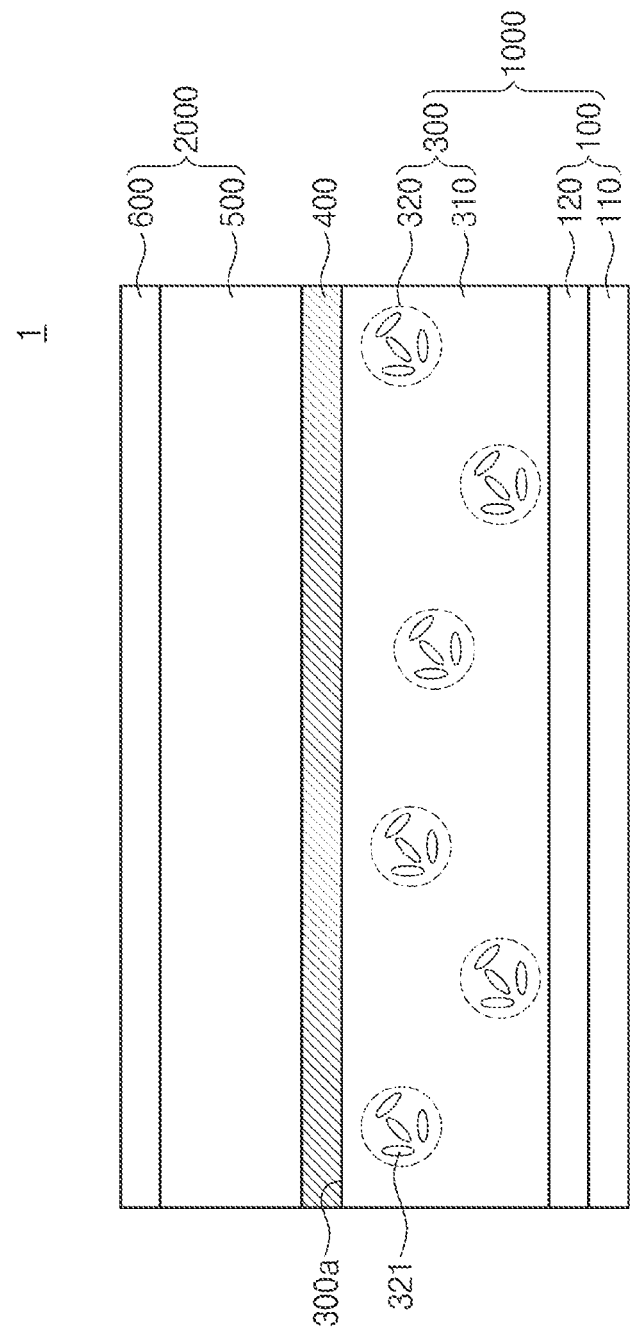

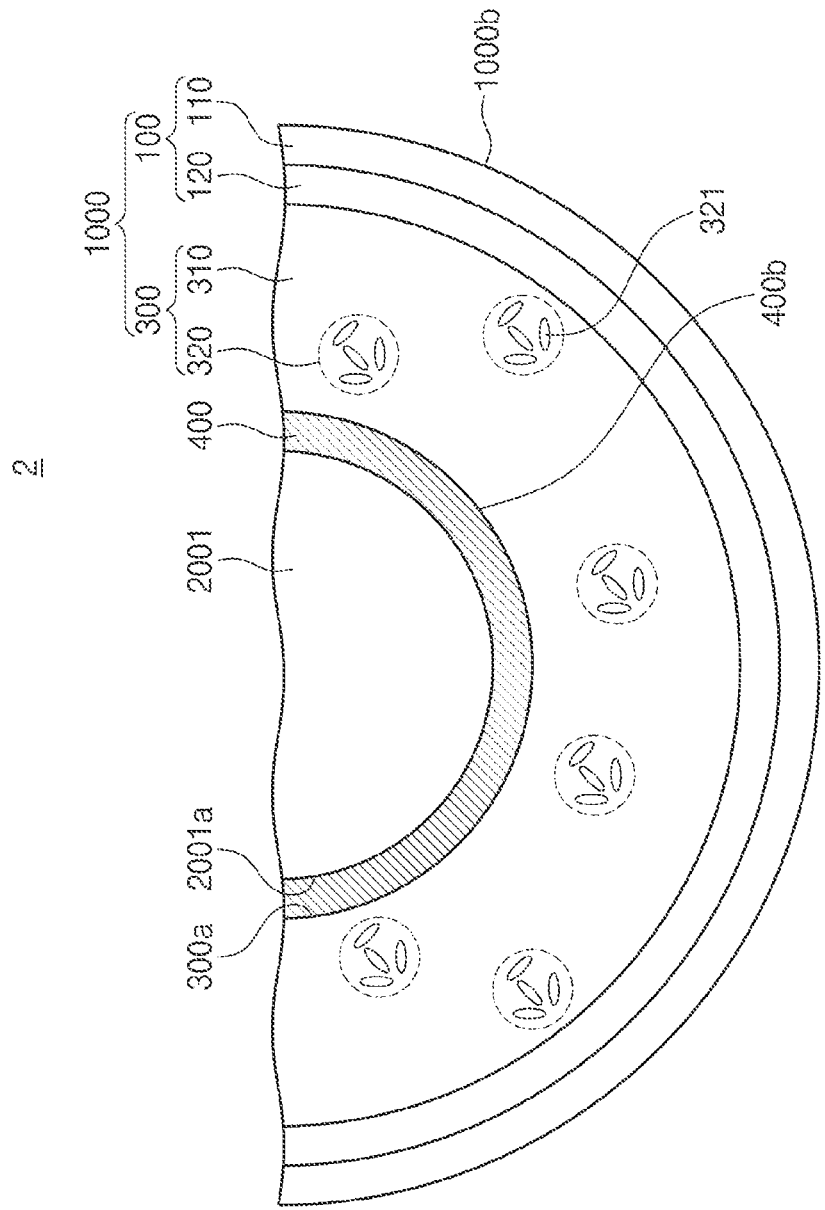

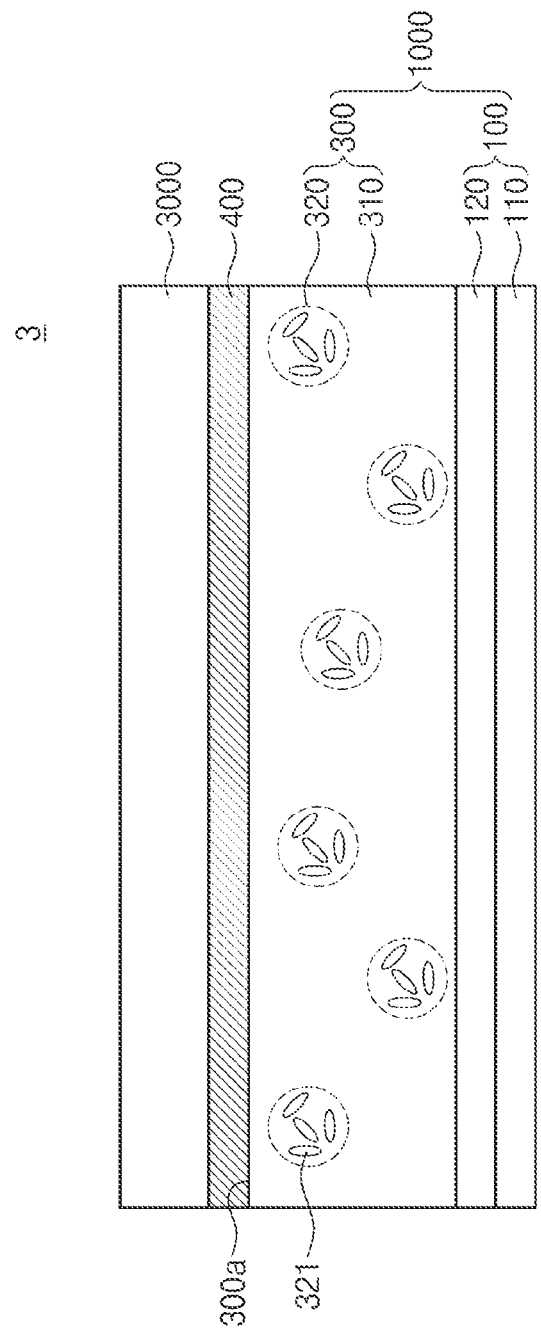

LIGHT EMITTING APPARATUS AND WINDOW

CROSS-REFERENCE TO RELATED APPLICATIONS

This is a continuation of U.S. application Ser. No. 17/173,718, filed on Feb. 11, 2021, which is a division of U.S. application Ser. No. 16/528,220, filed on Jul. 31, 2019 (issued on Mar. 16, 2021 as U.S. Pat. No. 10,948,784), which is a division of Ser. No. 15/654,831, filed on Jul. 20, 2017 (issued on Sep. 10, 2019 as U.S. Pat. No. 10,409,116), and claims priority under 35 U.S.C. § 119 of Korean Patent Application No. 10-2016-0163024, filed on Dec. 1, 2016, the entire contents of which are hereby incorporated by reference.

BACKGROUND

The present disclosure herein relates to manufacturing of a liquid crystal device, and more particularly, to manufacturing of an apparatus including a liquid crystal device.

Liquid crystals may be materials that are in a mesophase between crystal and liquid phases. The term 'liquid crystal' is derived from characteristics of liquidity of liquid and anisotropy of a crystal. Liquid crystals have order in position and direction in a crystal phase. However, liquid crystals have disorder in position and direction in a liquid phase.

Liquid crystals may be used in a polymer dispersed liquid crystal (PDLC) display device. The PDLC display device may be a device in which electric fields are applied to a layer, in which polymers and liquid crystals are uniformly mixed with each other, to change refractive indexes of the polymers and the liquid crystals so that light is scattered or transmitted.

SUMMARY

The present disclosure provides a miniaturized light emitting apparatus and a method for manufacturing the same.

The present disclosure also provides a miniaturized window and a method for manufacturing the same.

A light emitting apparatus, a method for manufacturing the light emitting apparatus, and a window are provided. An embodiment of the inventive concept provides a method for manufacturing a light emitting apparatus including: preparing a liquid crystal device including a support substrate, a first electrode, a liquid crystal layer, and a sacrificial structure; separating the sacrificial structure from the liquid crystal layer to expose one surface of the liquid crystal layer; and forming a second electrode on the one surface of the liquid crystal layer.

In an embodiment, the method may further include forming a light emitting layer on the second electrode.

In an embodiment, the first electrode may be in physical contact with the liquid crystal layer and the light emitting layer.

In an embodiment, the method may further include forming a third electrode on the light emitting layer.

In an embodiment, the sacrificial structure may include a sacrificial layer and a sacrificial substrate on the sacrificial layer.

In an embodiment, the separating of the sacrificial structure may include thermally treating the sacrificial structure under a temperature greater than a glass transition temperature or melting point of the sacrificial layer.

In an embodiment, the separating of the sacrificial structure may be performed by a physical method.

In an embodiment, the sacrificial layer may include a polymer, and the sacrificial layer may have a glass transition temperature of about 300° C. to about 700° C.

In an embodiment, the preparing of the liquid crystal device may include: forming a sacrificial layer on a sacrificial substrate; and rubbing a first surface of the sacrificial layer.

In an embodiment, the separating of the sacrificial structure may include: applying electrical fields to the liquid crystal layer; and applying physical force to the sacrificial structure.

In an embodiment, the preparing of the liquid crystal device may include: providing a precursor between the first electrode and the sacrificial structure to form a precursor layer; and applying heat or light to the precursor layer to form the liquid crystal layer.

In an embodiment of the inventive concept, a light emitting apparatus includes: a support substrate; a first electrode on the support substrate; a liquid crystal layer on the first electrode; a second electrode disposed on the liquid crystal layer and being in physical contact with the liquid crystal layer; and a light emitting device disposed on the second electrode and being in physical contact with the second electrode.

In an embodiment, the liquid crystal layer may include a polymer and a liquid crystal group within the polymer, and the liquid crystal group may include a plurality of liquid crystal molecules.

In an embodiment, the light emitting device may have a first surface be in contact with the second electrode, and the first surface of the light emitting device may have a curved surface.

In an embodiment, the support substrate, the first electrode, and the second electrode may be transparent.

In an embodiment of the inventive concept, a window includes: a glass layer; a liquid crystal device disposed on the glass layer and including a support substrate, a first electrode, and a liquid crystal layer, which are stacked; and a second electrode disposed between the glass layer and the liquid crystal device, wherein the second electrode is in physical direct contact with the glass layer and the liquid crystal layer.

In an embodiment, the liquid crystal layer may include a polymer and liquid crystal molecules.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 4 is a cross-sectional view of a light emitting apparatus according to an embodiment of the inventive concept;

FIG. 5 is a cross-sectional view of a light emitting apparatus according to another embodiment of the inventive concept; and FIG. 6 is a cross-sectional view of a window according to an embodiment of the inventive concept.

DETAILED DESCRIPTION

Figure 1A:
FIGS. 1A to 1E are cross-sectional views illustrating a method for manufacturing a liquid crystal device according to an embodiment of the inventive concept.

Exemplary embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. A person with ordinary skill in the technical field of the present invention pertains will be understood that the present invention can be carried out under any appropriate environments.

In the following description, the technical terms are used only for explaining a specific exemplary embodiment while not limiting the present invention. In this specification, the terms of a singular form may include plural forms unless specifically mentioned. The meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers (or films) in various embodiments of the present invention, the regions and the layers are not limited to these terms. These terms are used only to discriminate one region or layer (or film) from another region or layer (or film). Therefore, a layer referred to as a first layer in one embodiment can be referred to as a second layer in another embodiment. An embodiment described and exemplified herein includes a complementary embodiment thereof. Like reference numerals refer to like elements throughout.

Unless terms used in embodiments of the present invention are differently defined, the terms may be construed as meanings that are commonly known to a person skilled in the art.

Hereinafter, a liquid crystal device according to the inventive concept and a method for manufacturing the same will be described.

FIGS. 1A to 1E are cross-sectional views illustrating a method for manufacturing a liquid crystal device according to an embodiment of the inventive concept.

Referring to FIG. 1A, a first electrode 120 may be formed on a support substrate 110 to form an electrode structure 100. The support substrate 110 may be transparent. The support substrate 110 may include glass or plastic. The first electrode 120 may include transparent conductive oxide such as indium tin oxide or indium zinc oxide. For another example, the first electrode 120 may include silver nanowire, carbon nanotube, graphene, poly(3,4-ethylenedioxythiophene):polystyrene sulfonate (PEDOT:PSS), polyaniline, polythiophene, or a combination thereof.

Figure 1B:

Referring to FIG. 1B, a sacrificial layer 220 may be formed on a sacrificial substrate 210 to form a sacrificial structure 200. The sacrificial substrate 210 may include glass or plastic. The sacrificial layer 220 may include a polymer. For example, the sacrificial layer 220 may include polyethylene, polypropylene, poly(1-dodecane), poly(3-methyl-1-butene), poly(4-methyl-1-pentene), poly(3,3-dimethyl-1-butene), poly(5-methyl-1-hexene), poly(4,4-dimethyl-1-pentene), poly(vinyl alcohol), poly(vinyl chloride), poly(vinyl t-butyl ether), poly(vinyl n-butyl ether), polystyrene, poly(2-vinylnaphthalene), poly(4-vinylpyridine), poly(methyl methacrylate), poly(ether methacrylate), poly(t-butyl methacrylate), poly(vinyl acetate), Nylon 6, polycarbonate, poly(ethylene terephthalate), poly(ethylene naphthalate), epoxy, urea, and/or phenol resin. The sacrificial layer 220 may have a glass transition temperature of about 100° C. to about 150° C. For another example, the sacrificial layer 220 may have a melting point of about 100° C. to about 150° C. The sacrificial layer 220 may have a thickness of about 0.005 μm to about 10 μm.

Figure 1C:
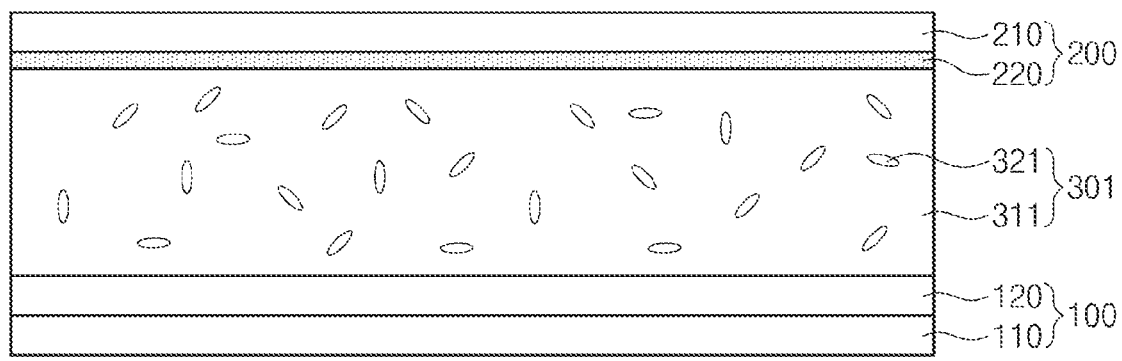

Referring to FIG. 1C, a precursor layer 301 may be formed between the electrode structure 100 and the sacrificial structure 200. The sacrificial structure 200 may be disposed on the electrode structure 100. Here, the sacrificial layer 220 may be vertically spaced apart from the first electrode 120. The electrode structure 100 may be formed as illustrated in FIG. 1A. The sacrificial structure 200 may be formed as illustrated in FIG. 1B. A precursor solution may be provided between the first electrode 120 and the sacrificial layer 220 to form the precursor layer 301. The precursor layer 301 may include a monomer 311, liquid crystal molecules 321, and an initiator (not shown). For example, the monomer 311 may include an acrylic-based monomer, an aromatic-based monomer, an acrylonitrile-based monomer, and/or a chloride-based monomer. For example, the acrylic-based monomer may include triethylopropane triacrylate (TMPTA), tri(propylene glycol) diacrylate (TPGDA), penthaerithritol triacrylate (PETA), trimethylolpropane ethoxylate triacrylate (TMPEOTA), methyl methacrylate (MMA), methacrylate (MA), tri(propylene glycol) glycerolate diacrylate (TPGDA), vinylacrylate (VA), ethylene glycol dimethacrylate (EGDA), epoxy acrylate monomer or oligomer, and/or 1,6-hexandiol diacrylate (HAD). The aromatic-based monomer may include styrene (ST) and/or divinyl benzene (DVB). The acrylonitrile-based monomer may include acrylonitrile (AN). The chloride-based monomer may include vinylidene chloride (VDC) and/or vinylbenzyl chloride (VBC). For another example, the monomer may include vinyl stearate (VS) and/or vinyl propionate (VP). The initiator may include a photoinitiator, a thermal initiator, and/or a redox initiator using redox reaction. The photoinitiator may include 1-hydroxy-cyclohexyl-phenyl-ketone, 2-methyl-1[4-(methylthio)phenyl]-2-morpholinopropane-1-one, 2-hydroxy-2-methyl-1-phenyl-propane-1-one, benzophenone, 2-hydroxy-1-[4-(2-hydroxyethoxy)phenyl]-2-methyl-1propanone, methylbenzoylformate (MBF), alpha, alpha-dimethoxy-alpha-phenylacetophenone, 2-benzyl-2-(dimethylamino)-1-[4-(morpholinyl) phenyl]-1-butanone, diphenyl (2,4,6-trimethylbenzoyl)-phosphine oxide, phenyl bis(2,4,6-trimethyl benzoyl phosphine oxide, Irgacure 819), bis(.eta.5-2,4-cyclopentadien-1-yl) bis[2,6-difluoro-3-(1H-pyrrol-1-yl)phenyl]titanium, 1-hydroxy-cyclohexylphenyl-ketone (CPA), and/or a combination thereof. The thermal initiator may include benzoyl peroxide (BP), acetyl peroxide (AP), diauryl peroxide (DP), di-tert-butyl peroxide (t-BTP), cumyl hydroperoxide (CHP), hydrogen peroxide (HP), potassium peroxide (PP), 2,T-azobisisobutyronitrile (AIBN), azocompound, and/or silver alkyls. The redox initiator using the redox reaction may include persulfates ($K_2S_2O_8$).

Figure 1D:
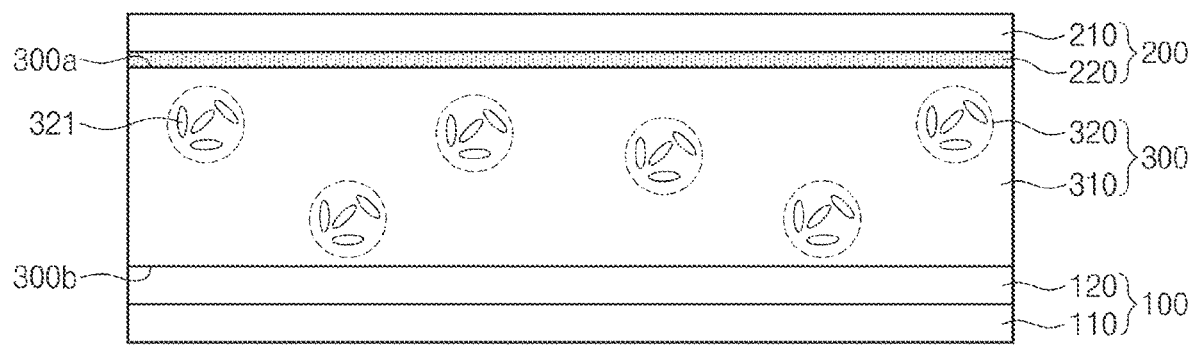

Referring to FIG. 1D, heat or light may be applied to the precursor layer (see reference numeral 301 of FIG. 1C) to form a liquid crystal layer 300. The liquid crystal layer 300 may include a polymer 310 and a liquid crystal group 320. The monomer 311 may be polymerized by the heat or light to form the polymer 310. The liquid crystal molecules 321 may be phase-separated from the polymer 310 to form the liquid crystal group 320. The liquid crystal group 320 may be provided in the polymer 310. The liquid crystal group 320 may include the plurality of liquid crystal molecules 321. The liquid crystal layer 300 may have one surface 300a and the other surface 300b, which face each other. The one surface 300a of the liquid crystal layer 300 may face the sacrificial layer 220.

Figure 1E:
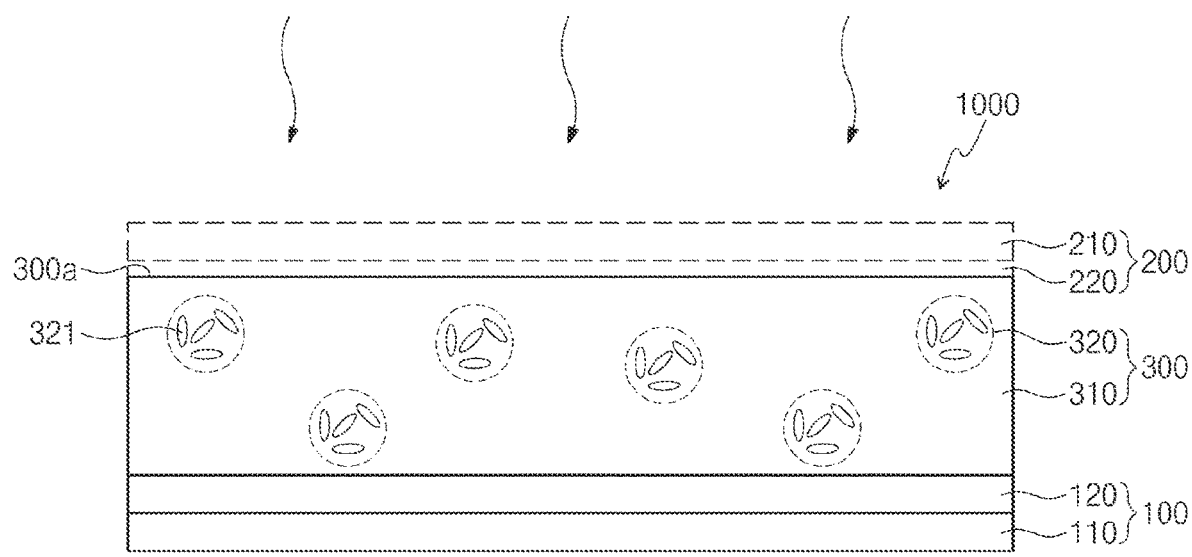

Referring to FIG. 1E, the sacrificial structure 200 may be thermally treated to be separated from the liquid crystal layer 300. A thermal treating process of the sacrificial structure 200 may be performed in a separate process that is different from the formation process of the liquid crystal layer 300, which are described with reference to FIG. 1D. The sacrificial structure 200 may be thermally treated under a temperature that is greater than the glass transition temperature or the melting point of the sacrificial layer 220. For example, the sacrificial structure 200 may be thermally treated at a temperature of about 100° C. to about 150° C. The sacrificial layer 220 may be transitioned to glass or melted by the thermal treatment. Thus, the sacrificial structure 200 may be easily removed from the liquid crystal layer 300. If the sacrificial layer 220 is omitted, the liquid crystal layer 300 may be damaged during the separation of the sacrificial structure 200, or it may be difficult to separate the sacrificial structure 200. The liquid crystal layer 300 may not be damaged by the sacrificial layer 220 during the separation of the sacrificial layer 220. The sacrificial substrate 210 and the sacrificial layer 220 may be removed at the same time or at different times. When the sacrificial structure 200 is removed, the one surface 300a of the liquid crystal layer 300 may be exposed. The liquid crystal device 1000 may be manufactured by the afore-described process. Since the sacrificial structure 200 is removed, the liquid crystal device 1000 may be thinned. In addition, the liquid crystal device 1000 may be reduced in mass.

Figure 2A:
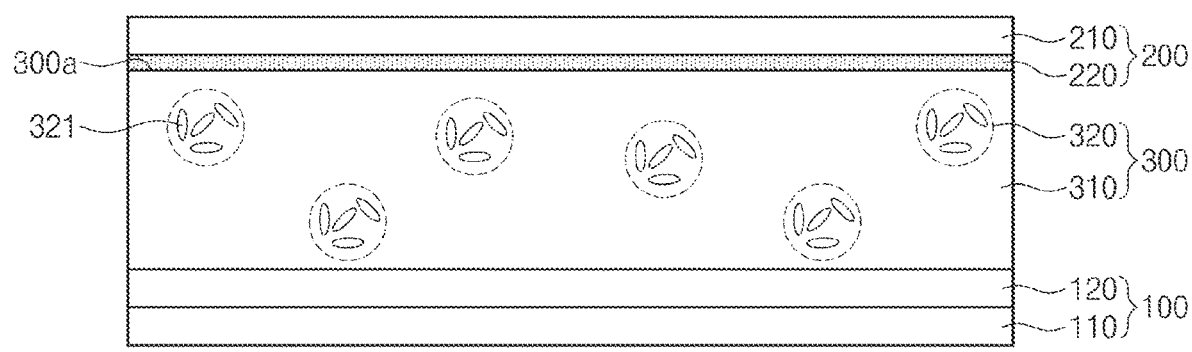
FIGS. 2A and 2B are cross-sectional views illustrating a method for manufacturing a liquid crystal device according to another embodiment of the inventive concept.
Figure 2B:
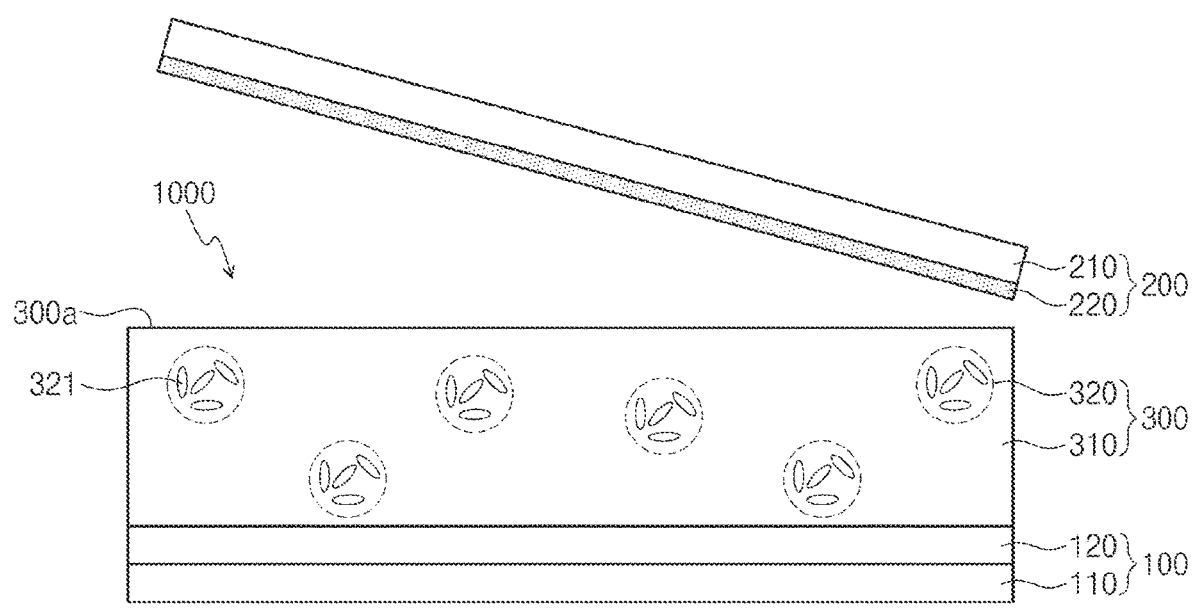

FIGS. 2A and 2B are cross-sectional views illustrating a method for manufacturing a liquid crystal device according to another embodiment of the inventive concept. Hereinafter, the duplicated descriptions, which have been described already, will be omitted.

Referring to FIG. 2A, a liquid crystal layer 300 may be formed between an electrode structure 100 and a sacrificial structure 200. A sacrificial layer 220 may be applied to a sacrificial substrate 210 to form the sacrificial structure 200. However, the sacrificial layer 200 may have a glass transition temperature of about 300° C. to about 700° C. The formation of the sacrificial layer 200 may include formation of an intermediate layer (not shown) by applying a monomer solution to the sacrificial substrate 210 and reaction of materials within the intermediate layer. For example, the reaction may be performed by applying heat, but is not limited thereto. The reaction within the intermediate layer may be at least a part of polymerization. While the sacrificial layer 200 is formed, stress may be applied to the sacrificial layer 220. The sacrificial layer 220 may have large stress. The stress may be tensile stress. The sacrificial layer 220 may include polyimide, polyarylate, cyclic olefin copolymer, and/or polynorbornene. The sacrificial layer 220 may have a thickness of about 0.005 μm to about 10 μm. The liquid crystal layer 300 may be formed as illustrated in FIG. 1C.

Referring to FIG. 2B, the sacrificial structure 200 may be separated from the liquid crystal layer 300 by a physical method to expose one surface 300a of the liquid crystal layer 300. Since the sacrificial layer 220 has large stress, bonding strength between the sacrificial layer 220 and the sacrificial substrate 210 may be greater than that between the sacrificial layer 220 and the liquid crystal layer 300. When the sacrificial layer 220 has a glass transition temperature of about 300° C. or less, the bonding strength between the sacrificial layer 220 and the liquid crystal layer 300 may increase. According to an embodiment, since the sacrificial layer 220 has a glass transition temperature of about 300° C. or more, the bonding strength between the sacrificial layer 220 and the liquid crystal layer 300 may be reduced. Since the process of separating the sacrificial layer 220 is performed under a temperature less than a phase transition temperature of liquid crystal molecules 321, the bonding strength between the sacrificial layer 220 and the liquid crystal layer 300 may be further reduced. For example, the separation process of the sacrificial layer 220 may be performed under a temperature of about 110° C. or less. Thus, the sacrificial layer 220 may be easily separated from the liquid crystal layer 300. While the sacrificial layer 220 is separated, the liquid crystal layer 300 may not be damaged. The liquid crystal device 1000 may be manufactured according to the example described above.

Figure 3A:
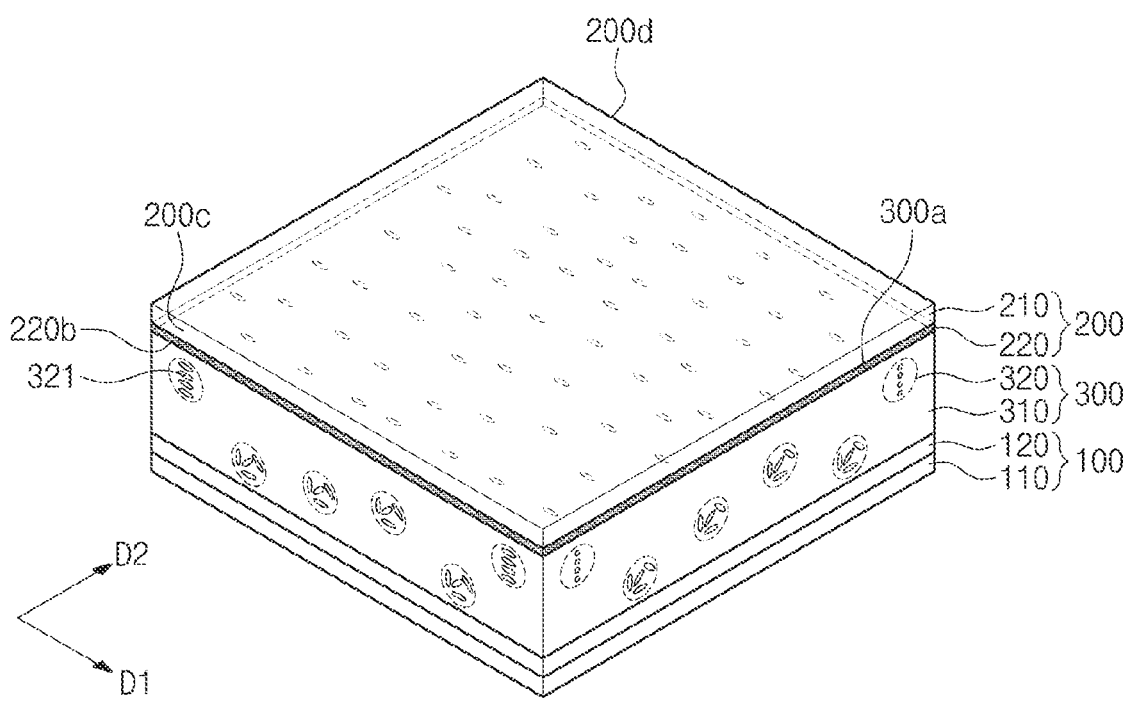
FIGS. 3A and 3B are cross-sectional views illustrating a method for manufacturing a liquid crystal device according to further another embodiment of the inventive concept.
Figure 3B:
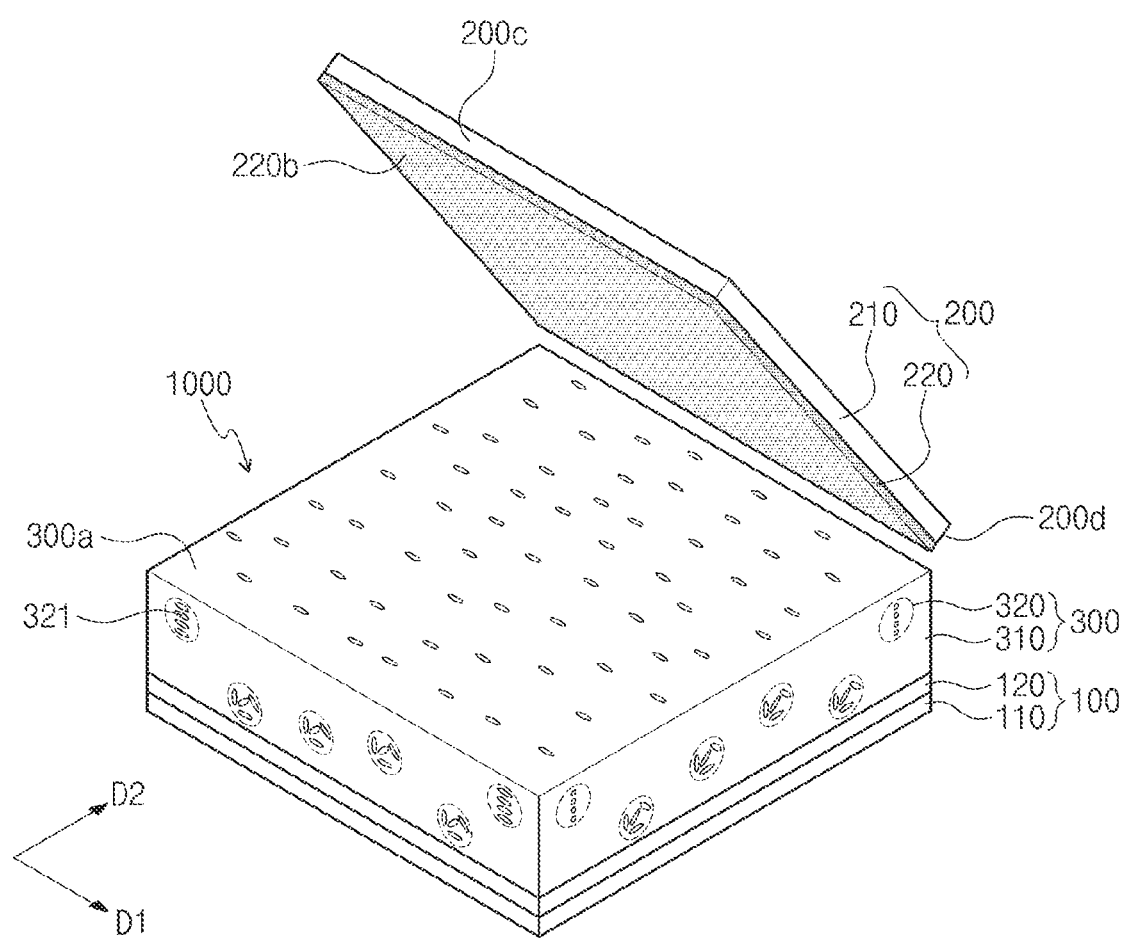

FIGS. 3A and 3B are cross-sectional views illustrating a method for manufacturing a liquid crystal device according to further another embodiment of the inventive concept. Hereinafter, the duplicated descriptions, which have been described already, will be omitted.

Referring to FIG. 3A, a sacrificial structure 200 may be prepared. The formation of the sacrificial structure 200 may include formation of a sacrificial layer 220 on a sacrificial substrate 210 and rubbing of a first surface 220b of the sacrificial layer 220. The sacrificial layer 220 may include polyimide, polyvinyl alcohol, silicon oxide, and/or silicon nitride. The sacrificial layer 220 may have a rubbing axis. The rubbing axis may be parallel to a first direction D1. The first direction D1 may be parallel to a top surface of a support substrate 110. A second direction D2 may be parallel to the top surface of the support substrate 110 and cross the first direction D1. For example, the second direction D2 may be perpendicular to the first direction D1.

The sacrificial structure 200 may be disposed to be spaced apart from an electrode structure 100. The liquid crystal layer 300 may be formed between the electrode structure 100 and the sacrificial structure 200. The first surface 220b of the sacrificial layer 220 may physically come into contact with a liquid crystal layer 300. Liquid crystal molecules 321 adjacent to the sacrificial layer 220 may have orientation. For example, the liquid crystal molecules 321 on one surface 300a of the liquid crystal layer 300 may have orientation. The liquid crystal molecules 321 may be orientated parallel to the rubbing axis of the sacrificial layer 200. The liquid crystal molecules 321 may be orientated parallel to the first direction D1.

Referring to FIG. 3B, the sacrificial structure 200 may be separated from the liquid crystal layer 300 by a physical method to expose one surface 300a of the liquid crystal layer 300. Physical force may be applied to one end of the sacrificial structure 200 to separate the sacrificial structure 200. In view of the plane, the sacrificial structure 200 may be separated in the second direction D2. For example, after the one end of the sacrificial structure 200 is spaced apart from the liquid crystal layer 300, the other end of the sacrificial structure 200 may be spaced apart from the liquid crystal layer 300. Here, the one end and the other end of the sacrificial structure 200 may be adjacent to a first side surface 200c and a second side surface 200d of the sacrificial structure 200, respectively. The first and second side surfaces 200c and 200d of the sacrificial structure 200 may be parallel to the first direction D1. Bonding strength between the liquid crystal layer 300 and the sacrificial layer 220 when the liquid crystal molecules 321 are parallel to the first direction D1 may be less than that between the liquid crystal layer 300 and the sacrificial layer 220 when the liquid crystal molecules 321 are parallel to the second direction D2. Thus, the sacrificial layer 220 may be easily separated from the liquid crystal layer 300. In the separation process of the sacrificial layer 220, electrical fields may be more applied to the liquid crystal layer 300. In this case, the orientation of the liquid crystal molecules 321 may be more improved by the electrical fields. The sacrificial layer 200 may be more easily separated. The separation process of the sacrificial layer 220 may be performed under a temperature less than a phase transition temperature of the liquid crystal molecules 321. The liquid crystal device 1000 may be manufactured according to the example described above. After the sacrificial structure 200 is separated, the liquid crystal molecules 321 on the one surface 300a of the liquid crystal layer 300 may be randomly oriented.

Hereinafter, a light emitting apparatus including a liquid crystal device and manufacturing of the light emitting apparatus will be described.

FIG. 4 is a cross-sectional view of a light emitting apparatus according to an embodiment of the inventive concept. Hereinafter, the duplicated descriptions, which have been described already, will be omitted.

Referring to FIG. 4, a light emitting apparatus 1 may include a liquid crystal device 1000, a second electrode 400, and a light emitting device 2000. The liquid crystal device 1000 may include a support substrate 110, a first electrode 120, and a liquid crystal layer 300. The light emitting device 2000 may include a light emitting layer 500 and a third electrode 600. The third electrode 600 may be disposed on the light emitting layer 500. The light emitting device 2000 may include an organic light emitting diode device, a field emission display (FED) device, or a plasma display panel (PDP) device. The light emitting device 2000 may emit light to the liquid crystal device 1000 through the second electrode 400.

The second electrode 400 may be disposed between the liquid crystal device 1000 and the light emitting device 2000. The second electrode 400 may be in physical contact with the liquid crystal layer 300 and the light emitting layer 500. The second electrode 400 may be transparent. The second electrode 400 may include transparent conductive oxide such as indium tin oxide or indium zinc oxide. For another example, the second electrode 400 may include silver nanowire, carbon nanotube, graphene, poly(3,4-ethylenedioxythiophene):polystyrene sulfonate (PEDOT:PSS), polyaniline, polythiophene, or a combination thereof. The second electrode 400 may function as an electrode of the liquid crystal device 1000 and an electrode of the light emitting device 2000. For example, orientation of liquid crystal molecules 321 may be adjusted by a voltage difference between the first electrode 120 and the second electrode 400. Thus, the liquid crystal layer 300 may be adjusted in transmissivity. Emission of light of the light emitting layer 500 may be determined by a voltage difference between the second electrode 400 and the third electrode 600. The liquid crystal device 1000 and the light emitting device 2000 may share the second electrode 400, and thus, an additional electrode may not be provided between the liquid crystal device 1000 and the light emitting device 2000. Thus, the light emitting apparatus 1 may be miniaturized. Since an additional substrate (for example, the sacrificial substrate (see reference numeral 210 of FIG. 1E) is not disposed between the liquid crystal device 1000 and the light emitting device 2000, the light emitting apparatus 1 may be more miniaturized.

A process of forming the light emitting apparatus 1 may include a process of forming a second electrode 400 on a light emitting device 2000, a process of preparing a liquid crystal device 1000, and a process of disposing the second electrode 400 on a liquid crystal layer 300. The liquid crystal device 1000 may be manufactured as the examples described with reference to FIGS. 1A to 1E, FIGS. 2A and 2B, or FIGS. 3A and 3B. The second electrode 400 may come into direct contact with the one surface 300a of the liquid crystal layer 300. The process of forming the second electrode 400 on the light emitting device 200 may be performed before or after the second electrode 400 is disposed on the liquid crystal layer 300.

The light emitting apparatus 1 may be used in various fields such as display apparatuses, lighting fixtures, and/or signboards.

FIG. 5 is a cross-sectional view of a light emitting apparatus according to another embodiment of the inventive concept. Hereinafter, the duplicated descriptions, which have been described already, will be omitted.

Referring to FIG. 5, a light emitting apparatus 2 may include a liquid crystal device 1000, a second electrode 400, and a light emitting device 2001. A first surface 2001a of the light emitting device 2001 has a curved surface. The second electrode 400 may be disposed on the light emitting device 2001 and be in physical contact with the first surface 2001a of the light emitting device 2001. The second electrode 400 may be flexible. The second electrode 400 may have a shape corresponding to that of the first surface 2001a of the light emitting device 2001. For example, a bottom surface 400b of the second electrode 400 may have a curved surface.

The liquid crystal device 1000 may be disposed on the bottom surface 400b of the second electrode 400. The liquid crystal device 1000 may include a support substrate 110, a first electrode 120, and a liquid crystal layer 300. One surface 300a of the liquid crystal layer 300 may be in physical contact with the second electrode 400. The liquid crystal device 1000 may be flexible. A bottom surface 1000b of the liquid crystal device 1000 may have a curved surface.

The light emitting apparatus 2 may be formed through substantially the same method as described with reference to FIG. 4. For example, a process of forming the light emitting apparatus 2 may include a process of forming a second electrode 400 on a light emitting device 2001, a process of preparing a liquid crystal device 1000, and a process of disposing the second electrode 400 on a liquid crystal layer 300 of the liquid crystal device 1000.

Hereinafter, a window including a liquid crystal device and manufacturing of the window will be described.

FIG. 6 is a cross-sectional view of a window according to an embodiment of the inventive concept. Hereinafter, the duplicated descriptions, which have been described already, will be omitted.

Referring to FIG. 6, a window 3 may include a liquid crystal device 1000, a second electrode 400, and a glass layer 3000. The glass layer 3000 may be transparent. Light may pass through the glass layer 3000 and then be incident into the second electrode 400. The second electrode 400 may be formed on the glass layer 3000. For example, the second electrode 400 may be formed through a deposition process. The second electrode 400 may come into direct contact with the glass layer 3000. The second electrode 400 may be transparent. Light may pass through the second electrode 400 and then be incident into the liquid crystal device 1000.

The liquid crystal device 1000 may be disposed on the glass layer 3000. The liquid crystal device 1000 may be manufactured according to the example described above. The liquid crystal device 1000 may be attached to the second electrode 400 so that one surface 300a of the liquid crystal layer 300 is in physical direct contact with the second electrode 400. The liquid crystal layer 300 may be adjusted in transmissivity by a voltage difference between the first electrode 120 and the second electrode 400. According to the embodiments, an additional substrate may not be disposed between the liquid crystal layer 300 and the glass layer 3000. Therefore, the window 3 may be reduced in thickness.

According to the inventive concept, the sacrificial structure may be removed to expose one surface of the liquid crystal layer. The light emitting apparatus or the window may be manufactured by using the liquid crystal device. The second electrode may be in physical direct contact with the liquid crystal layer and the light emitting device. The liquid crystal device and the light emitting device may share the second electrode. The light emitting apparatus may be miniaturized. Since an additional substrate is not provided between the liquid crystal device and the light emitting device, the light emitting apparatus may be more miniaturized.

According to the embodiments, the second electrode may be in physical direct contact with the liquid crystal device and the glass layer. Therefore, the window may be miniaturized.

Although the exemplary embodiments of the present invention have been described, it is understood that the present invention should not be limited to these exemplary embodiments but various changes and modifications can be made without departing from the spirit of the invention. Furthermore, the appended claims should be appreciated as a step including even another embodiment.

What is claimed is:

1. A method for manufacturing a window, the method comprising:
    preparing a liquid crystal device comprising a support substrate, a first electrode, a liquid crystal layer, and a sacrificial structure, which are stacked, the liquid crystal layer being disposed between the first electrode and the sacrificial structure;
    removing the sacrificial structure from the liquid crystal device to expose one surface of the liquid crystal layer;
    forming a second electrode disposed on a glass layer;
    attaching the liquid crystal device to the second electrode so that the exposed one surface of the liquid crystal layer is in physical direct contact with a first surface of the second electrode,
    wherein a second surface of the second electrode is in physical direct contact with the glass layer, and
    wherein the second surface of the second electrode is opposite to the first surface of the second electrode.

2. The method of claim 1, wherein the liquid crystal layer comprises a polymer and a liquid crystal group within the polymer,
    wherein the liquid crystal group includes a plurality of liquid crystal molecules, and
    wherein the plurality of liquid crystal molecules are phase-separated from the polymer.

3. The method of claim 1, wherein the forming the second electrode includes performing a deposition process.

4. The method of claim 1, wherein the sacrificial structure includes a sacrificial layer and a sacrificial substrate on the sacrificial layer.

5. The method of claim 4, wherein the removing the sacrificial structure comprises thermally treating the sacrificial structure under a temperature greater than a glass transition temperature or melting point of the sacrificial layer.

6. The method of claim 4, wherein the sacrificial layer comprises a polymer, and
    the glass transition temperature of the sacrificial layer ranges from about 300° C. to about 700° C.

7. The method of claim 1, wherein the preparing of the liquid crystal device includes:
    providing a precursor between the first electrode and the sacrificial structure to form a precursor layer; and
    applying heat or light to the precursor layer to form the liquid crystal layer.

8. The method of claim 1, wherein the preparing of the liquid crystal device includes:
    forming a sacrificial layer on a sacrificial substrate; and
    rubbing a first surface of the sacrificial layer.

9. The method of claim 8, wherein the removing of the sacrificial structure includes:
    applying electrical fields to the liquid crystal layer; and
    applying physical force to the sacrificial structure.

10. The method of claim 1, wherein the attaching the liquid crystal device is performed after the removing the sacrificial structure.

* * * * *